(12) United States Patent
Wang et al.

(10) Patent No.: US 11,624,788 B2
(45) Date of Patent: Apr. 11, 2023

(54) DISPLAY MODULE TEST PLATFORM

(71) Applicant: KUNSHAN GO-VISIONOX OPTO-ELECTRONICS CO., LTD., Kunshan (CN)

(72) Inventors: Yuqing Wang, Kunshan (CN); Feng Chen, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 365 days.

(21) Appl. No.: 16/831,858

(22) Filed: Mar. 27, 2020

(65) Prior Publication Data

US 2020/0225296 A1    Jul. 16, 2020

Related U.S. Application Data

(63) Continuation of application No. PCT/CN2019/079713, filed on Mar. 26, 2019.

(30) Foreign Application Priority Data

Sep. 19, 2018  (CN) .......................... 201811096223.7

(51) Int. Cl.
*G06F 13/00* (2006.01)
*G01R 31/56* (2020.01)
(Continued)

(52) U.S. Cl.
CPC ............ *G01R 31/56* (2020.01); *G06F 3/041* (2013.01); *G06F 3/14* (2013.01); *G06F 9/45545* (2013.01);
(Continued)

(58) Field of Classification Search
None
See application file for complete search history.

(56) References Cited

U.S. PATENT DOCUMENTS

| 2003/0093715 | A1* | 5/2003 | Hasako | .................. | H04N 17/04 |
| | | | | | 348/E17.005 |
| 2008/0201506 | A1* | 8/2008 | Lee | ..................... | G06F 13/4004 |
| | | | | | 710/100 |

(Continued)

FOREIGN PATENT DOCUMENTS

| CN | 201765405 U | 3/2011 |
| CN | 104318882 A | 1/2015 |

(Continued)

OTHER PUBLICATIONS

Notification of Grant Regarding Chinese application dated Apr. 14, 2020 in the corresponding CN application (application No. 201811096223.7).

(Continued)

*Primary Examiner* — Henry Tsai
*Assistant Examiner* — Dean Phan
(74) *Attorney, Agent, or Firm* — Kilpatrick Townsend & Stockton

(57) ABSTRACT

The present application relates to the field of display technology, and discloses a display module test platform, including a core processor. The core processor is capable of supporting installation of a terminal operating system. A display output terminal of the core processor is connected to a display module to be tested. The display module to be tested includes a touch structure. The touch structure and the core processor communicate with each other via an Inter-Integrated Circuit (I2C) bus.

19 Claims, 2 Drawing Sheets

(51) Int. Cl.
*G06F 3/041* (2006.01)
*G06F 3/14* (2006.01)
*G06F 9/455* (2018.01)
*G06F 13/40* (2006.01)
*G06F 13/42* (2006.01)
*G06F 3/04883* (2022.01)

(52) U.S. Cl.
CPC ...... *G06F 13/4081* (2013.01); *G06F 13/4282* (2013.01); *G06F 3/04883* (2013.01); *G06F 2213/0016* (2013.01)

(56) References Cited

U.S. PATENT DOCUMENTS

| | | | | |
|---|---|---|---|---|
| 2012/0044158 | A1* | 2/2012 | Chang | G06F 8/71 345/173 |
| 2013/0018624 | A1* | 1/2013 | Bhatnagar | G01R 31/58 702/119 |
| 2014/0278244 | A1* | 9/2014 | Humphrey | G06F 11/22 702/182 |
| 2015/0100254 | A1* | 4/2015 | Chen | G06F 3/042 702/58 |
| 2015/0145548 | A1* | 5/2015 | Duncan | G01R 3/00 29/592.1 |
| 2015/0341631 | A1* | 11/2015 | Lu | H04N 17/045 348/189 |
| 2016/0337053 | A1 | 11/2016 | Diperna et al. | |
| 2017/0018213 | A1 | 1/2017 | Yang et al. | |
| 2017/0023637 | A1 | 1/2017 | Yang et al. | |
| 2017/0370964 | A1* | 12/2017 | Chen | G01R 1/0416 |
| 2018/0277030 | A1 | 9/2018 | Wang et al. | |

FOREIGN PATENT DOCUMENTS

| | | |
|---|---|---|
| CN | 104575342 A | 4/2015 |
| CN | 204596389 U | 8/2015 |
| CN | 104992648 A | 10/2015 |
| CN | 105045692 A | 11/2015 |
| CN | 106526332 A | 3/2017 |
| CN | 106847144 A | 6/2017 |

OTHER PUBLICATIONS

International Search Report dated May 24, 2019 in the corresponding international application(application No. PCT/CN2019/079713).

International Written Opinion dated May 24, 2019 in the corresponding international application(application No. PCT/CN2019/079713).

CN First Office Action dated Dec. 25, 2019 in the corresponding CN application(applicaiton No. 201811096223.7).

* cited by examiner

DISPLAY MODULE TEST PLATFORM

CROSS-REFERENCES TO RELATED APPLICATIONS

The present application is a continuation of International Application No. PCT/CN2019/079713, filed Mar. 26, 2019, which claims priority to Chinese Patent Application No. 201811096223.7, filed Sep. 19, 2018. Both applications are incorporated by reference herein in their entireties for all purposes.

TECHNICAL FIELD

The present application relates to the field of display technology, and specifically to a display module test platform.

BACKGROUND

An organic electroluminescent display has advantages such as self-luminescence, wide viewing angles, and high contrast, and has gradually become the mainstream technology in the field of display technology. A display module of an organic electroluminescent display device usually needs to be tested before delivery to ensure normal display. Currently, commercially available test devices cannot realistically present the display effect of a complete terminal on a display module. As a result, it is likely that abnormal display modules fail to be detected in time and enter the terminal market.

SUMMARY

In view of this, embodiments of the present application provide a display module test platform, to solve the problem that commercially available display module test devices cannot realistically present the display effect of a complete terminal on a display module.

An embodiment of the present application provides a display module test platform, including: a core processor, capable of supporting installation of a terminal operating system, wherein a display output terminal of the core processor is connected to a display module to be tested, the display module to be tested includes a touch structure, and the touch structure and the core processor communicate with each other via an Inter-Integrated Circuit bus.

Optionally, the display module test platform further includes: a memory, connected to the core processor, and configured to store a correspondence relation between a model of a display module and configuration parameters, wherein the core processor is configured to: determine, according to the correspondence relation stored in the memory, configuration parameters corresponding to a model of the display module to be tested, and output the configuration parameters to the display module to be tested.

Optionally, the display module test platform further includes an acquisition module, connected to the display module to be tested and the core processor respectively, and configured to: acquire a voltage and a current of the display module to be tested, and send the voltage and current to the core processor.

Optionally, the terminal operating system is any one of an Android operating system, an iOS operating system, a Windows operating system, and a Linux operating system.

Optionally, the display module test platform further includes: an input interface, connected to the core processor and an input device respectively, wherein the input device is configured to control the display module to be tested.

Optionally, the input interface is an On-The-Go interface, and the input device connected to the On-The-Go interface is a mouse and/or a keyboard.

Optionally, the display output terminal of the core processor is directly connected to the display module to be tested; and/or the display output terminal of the core processor is connected to the display module to be tested via a bridge module, and the bridge module is configured to convert a display output signal of the core processor into a test signal matching the display module to be tested.

Optionally, the display module test platform further includes: a Universal Asynchronous Receiver-Transmitter interface, connected to the core processor, and configured to return test information of the display module to be tested.

Optionally, the display module test platform further includes: a storage interface, connected to the core processor and a storage device respectively, wherein the storage device is configured to store test images and test videos.

Optionally, the core processor is a processor based on the Advanced Reduced Instruction Set Computing Machine architecture.

Optionally, the display module test platform further includes a power supply, connected to the display module to be tested and the core processor, and configured to supply power to the display module to be tested and the core processor.

Another embodiment of the present application provides a method for initializing the aforementioned display module test platform, comprising: building a compiling environment, wherein specifically, a virtual machine VMWare and Ubuntu12.04 are installed to enable the compilation of an Android operating system; starting a core, and loading a driver of an Embedded Display Port to Mobile Industry Processor Interface bridge chip; requesting, by the bridge chip, an Inter-Integrated Circuit bus to perform initialization; loading a driver of an Embedded Display Port bus; detecting, by using a Hot Plug Detect pin, whether the bridge chip is connected, and if the bridge chip is not connected, stopping loading an Embedded Display Port driving procedure, or if the bridge chip is connected, initializing an auxiliary channel, wherein the auxiliary channel uses a differential transmission mode for transmission of data with a low bandwidth requirement, link management, and device control; reading and writing, by an Advanced Reduced Instruction Set Computing Machine processor, display parameters, Embedded Display Port configuration data, and the like by using the auxiliary channel; mounting the Embedded Display Port bus successfully, and outputting an Embedded Display Port signal; entering an Embedded Display Port link training stage, comprising adjusting the amplitude of a link layer signal and a voltage intensity, testing an on-off state, and the like, and if the Embedded Display Port link training stage fails, stopping loading the Embedded Display Port driving procedure, or if the Embedded Display Port link training stage succeeds, initializing, by the bridge chip, the display module to be tested; initializing, by a driver chip in the display module to be tested, a power supply, to enable the power supply to output a voltage required by the display module to be tested; and outputting, by the bridge chip, an Mobile Industry Processor Interface image signal to the display module to be tested, wherein the display module to be tested implements image display.

The technical solution provided in the embodiments of the present application has the following advantages:

The display module test platform provided in the embodiments of the present application includes a core processor. The core processor is capable of supporting installation of a terminal operating system, and a display output terminal of the core processor is connected to a display module to be tested. Therefore, during the test of the display module to be tested, an interface of the terminal operating system may be displayed on the display module to be tested, and the display effect of a complete terminal can be realistically presented in a test stage on the display module to be tested, so that it is convenient to detect in time defects that tend to occur during the display by the display module in the complete terminal, thereby improving product yields.

In addition, the core processor and the touch structure in the display module to be tested communicate with each other via an I²C bus. That is, the core processor provides the display module to be tested with a touch test function. In this way, in a test stage, the terminal operating system and touch gestures can be combined to test the display module to be tested, thereby maximally presenting a terminal use effect and enhancing use functions of the display module test platform.

In the display module test platform provided in the embodiments of the present application, the core processor is a processor based on the ARM architecture. ARM architecture processors have relatively high execution efficiency and relatively low costs and are widely applied to embedded system design.

In the display module test platform provided in the embodiments of the present application, the terminal operating system is any one of an Android operating system, an iOS operating system, a Windows operating system, and a Linux operating system. That is, different operating systems may be installed according to display modules in different application fields, so that wide choices are available, and more varied and compatible tests are provided.

In the display module test platform provided in the embodiments of the present application, the display output terminal of the core processor is directly connected to the display module to be tested; and/or the display output terminal of the core processor is connected to the display module to be tested via a bridge module, and the bridge module is configured to convert a display output signal of the core processor into a test signal matching the display module to be tested. During an actual test, the core processor may directly transmit an initial signal to the display module to be tested or may convert an initial signal by using the bridge module and transmit a converted signal to the display module to be tested.

The display module test platform provided in the embodiments of the present application further includes an input interface. The input interface is connected to the core processor and an input device respectively. The input device is configured to control the display module to be tested. In this way, when the touch function of the display module to be tested encounters a failure, the input device may be used to input and control content displayed by the display module to be tested.

In the display module test platform provided in the embodiments of the present application, the input interface is an OTG (On-The-Go) interface, and the input device connected to the OTG interface is a mouse and/or a keyboard. The OTG interface may implement data transfer between devices without a personal computer (PC) host, so that an interface on the display module to be tested may be controlled anywhere and anytime by using the mouse and/or the keyboard, and operations are very convenient.

The display module test platform provided in the embodiments of the present application further includes a UART interface. The UART interface is connected to the core processor and is configured to return test information of the display module to be tested. A UART is a universal serial bus (USB) for asynchronous communication, and can implement full-duplex transmission and reception. In an embedded design, the UART is used for communicating with a PC. In this embodiment, the UART interface is also connected to the PC to transfer debugging information and test information.

The display module test platform provided in the embodiments of the present application further includes a storage interface. The storage interface is connected to the core processor and a storage device respectively. The storage device is configured to store test images and test videos. During actual application, the storage device may store images to be displayed and videos to be played. When an image or a video needs to be displayed on the display module to be tested, an image and a video stored in advance in the storage device may be sent via the storage interface to the display module to be tested for test.

DETAILED DESCRIPTION OF THE INVENTION

To make the objectives, technical solutions, and advantages of the embodiments of the present application more clearly, the following clearly and completely describes the technical solutions in the embodiments of the present application with reference to the accompanying drawings in the embodiments of the present application. Apparently, the described embodiments are merely a part rather than all of the embodiments of the present application. All the other embodiments obtained by persons skilled in the art based on the embodiments of the present application without creative efforts shall fall within the protection scope of the present application.

In the description of the present application, unless otherwise expressly specified and defined, terms such as "connected" and "connection" should be understood in a broad sense, for example, fixedly connected, detachably connected or integrally connected; or mechanically connected or electrically connected; or connected directly or through an intermediate, or two elements communicating internally or two elements connected in a wireless or wired manner. For persons of ordinary skill in the art, specific meanings of the terms in the present application should be understood according to specific conditions.

In addition, the technical features in different implementations of the present application described below can be combined with each other without causing any conflict.

Figure 1:
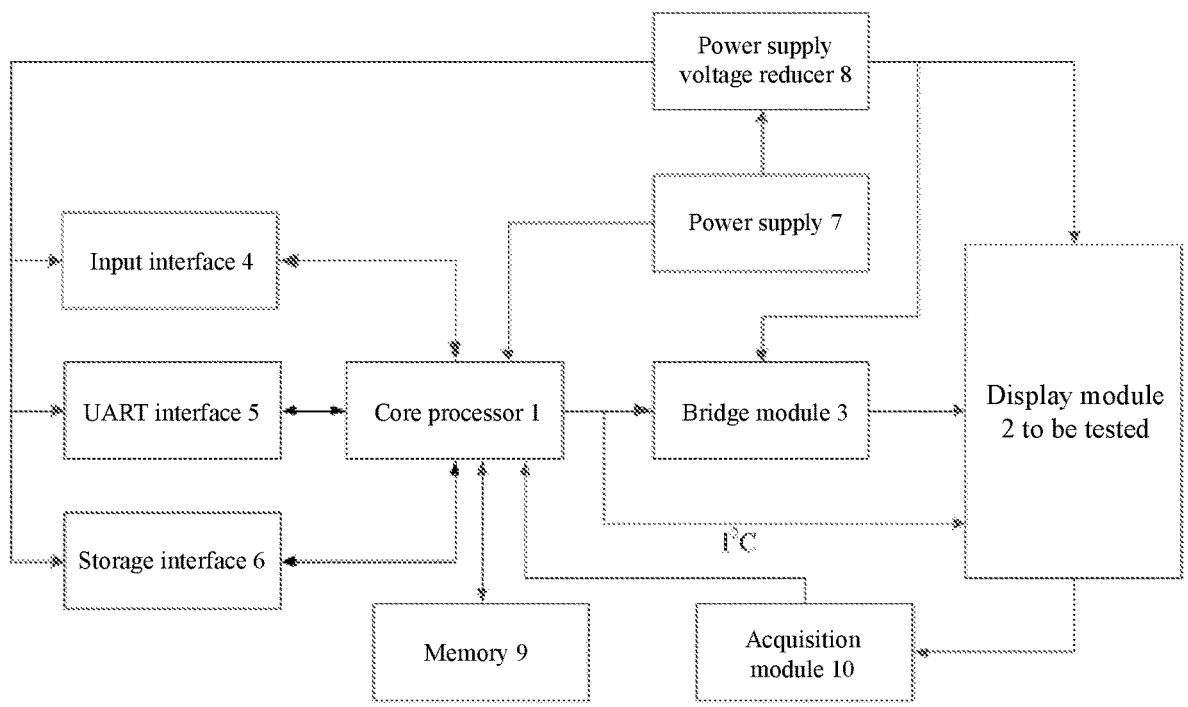
FIG. 1 is a schematic structural diagram of a display module test platform according to an embodiment of the present application.

An embodiment of the present application provides a display module test platform configured to test a display module 2 to be tested. As shown in FIG. 1, the display module test platform includes a core processor 1. The core processor 1 can support installation of a terminal operating system. A display output terminal of the core processor 1 is connected to the display module 2 to be tested. Optionally, the display module 2 to be tested may be a display screen, for example, an organic light-emitting diode (OLED) display screen. The type of the display module 2 to be tested is not limited herein.

The core processor 1 in this embodiment may be a processor based on the ARM (Advanced Reduced Instruction Set Computing (RISC) Machine) architecture, for example, an ARM7 series processor, an ARM9 series processor, an ARM9E series processor or an ARM10 series processor, and may be selected according to an actual requirement during actual use. ARM architecture processors are widely applied to embedded system design and have varied functions, simple development, and relatively high execution efficiency and relatively low costs. In addition, flexible system tailoring can be implemented. In this embodiment of the present application, an ARM architecture processor is chosen as the core processor 1, so that the test efficiency of the test platform is improved and the terminal operating system and the display module 2 to be tested can be tested together.

By means of the display module test platform provided in this embodiment of the present application, during the test of the display module 2 to be tested, an interface of the terminal operating system may be displayed on the display module 2 to be tested, and the display effect of a complete terminal can be realistically presented in a test stage on the display module 2 to be tested, so that it is convenient to detect and remedy in time defects that tend to occur during the display by the display module in the complete terminal, thereby improving product yields.

In this embodiment, the terminal operating system of which installation is supported by the core processor 1 may be any one of an Android operating system, an iOS operating system, a Windows operating system, and a Linux operating system. Display modules to be tested have a very wide range of applications and may be applied to various electronic devices such as an Apple phone, an Android phone, a tablet computer or a PC. Different operating systems are usually used on different electronic devices. The core processor 1 in this embodiment of the present application may support various operating systems in the foregoing. That is, corresponding operating systems may be installed for display modules in different application fields. That is, display modules in various different application fields can be tested on one test platform, thereby achieving high compatibility.

In this embodiment, the display module 2 to be tested includes a touch structure. The touch structure and the core processor 1 communicate with each other via an I²C (Inter-Integrated Circuit) bus. That is, the core processor 1 provides the display module 2 to be tested with a touch test function. In this way, in a test stage, the terminal operating system and touch gestures can be combined to test the display module 2 to be tested, thereby maximally presenting a terminal use effect and enhancing use functions of the display module test platform. In this embodiment, the display module 2 to be tested may further include a driving module such as a driver chip, a driver circuit or a driver and a display module such as a display device.

As an optional implementation, the display module test platform provided in this embodiment includes a memory 9. The memory 9 is connected to the core processor 1 and configured to store a correspondence relation between a model of a display module 2 to be tested and configuration parameters. The core processor 1 is configured to: determine, according to the correspondence relation stored in the memory 9, configuration parameters corresponding to a model of the display module 2 to be tested, and output the configuration parameters to the display module 2 to be tested.

There are various models of display modules to be tested, and different configuration parameters are used for different models of display modules. Therefore, a correspondence relation between a model of a display module and configuration parameters is stored in advance in a memory in this embodiment. During an actual test, a core processor may determine, according to the correspondence relation, configuration parameters corresponding to a model of the display module that needs to be tested currently, so that correct configuration parameters can be combined to test the display module that needs to be tested currently. In this way, the test platform provided in this embodiment can be used to test various models of display modules and has high applicability.

In this embodiment, the configuration parameters may include parameters such as initialization code, driving timing, and power-on timing of a display module, which are not enumerated herein.

In an optional implementation, the display module test platform provided in this embodiment includes an acquisition module 10. The acquisition module 10 is connected to the display module 2 to be tested and the core processor 1 respectively, and is configured to: acquire a voltage and a current of the display module 2 to be tested, and send the voltage and current information to the core processor 1. In this way, voltage and current information of the display module 2 to be tested can be monitored in real time, and an anomaly is detected in time once it occurs. Optionally, the acquisition module 10 may be an acquisition circuit, an acquisition device or the like.

In this embodiment, the display output terminal of the core processor 1 may be directly connected to the display module 2 to be tested. That is, a Mobile Industry Processor Interface (MIPI) signal sent by an ARM processor is directly sent to the display module 2 to be tested, thereby facilitating direct control. The display output terminal of the core processor 1 may be alternatively connected to the display module 2 to be tested via a bridge module 3. The bridge module 3 is configured to convert a display output signal of the core processor 1 into a test signal matching the display module 2 to be tested. That is, an Embedded Display Port (eDP) signal sent by the ARM processor is converted into an MIPI signal recognizable by the display module 2 to be tested, and the MIPI signal is sent to the display module 2 to be tested. The bridge module 3 and the core processor 1 are connected by the I²C bus. Optionally, the bridge module 3 may be a bridge circuit, a bridge chip or the like.

The foregoing two manners may coexist or may exist separately, which depends on an actual requirement. This is not limited herein.

As an optional implementation, the display module test platform provided in this embodiment further includes an input interface 4. The input interface 4 is connected to the core processor 1 and an input device respectively. The input device is configured to control the display module 2 to be tested. In this way, when the touch function of the display module 2 to be tested encounters a failure, the input device may be used to input and control content displayed by the display module 2 to be tested.

Preferably, the input interface 4 is an OTG (On-The-Go) interface, and the input device connected to the OTG interface is a mouse and/or a keyboard. The OTG interface may implement data transfer between devices without a PC host, so that an interface on the display module 2 to be tested may be controlled anywhere and anytime by using the mouse and/or the keyboard, and operations are very convenient.

As an optional implementation, the display module test platform provided in this embodiment further includes a UART (Universal Asynchronous Receiver-Transmitter) interface 5. The UART interface 5 is connected to the core processor 1 and is configured to return test information of the display module 2 to be tested. A UART is a USB for asynchronous communication, and can implement full-duplex transmission and reception. In an embedded design, the UART is used for communicating with a PC. In this embodiment, the UART interface 5 is also connected to the PC to transfer debugging information and test information.

As an optional implementation, the display module test platform provided in this embodiment further includes a storage interface 6. The storage interface 6 is connected to the core processor 1 and a storage device. The storage device is configured to store test images and test videos. An external storage device may be a memory card or a hard disk or the like. During actual application, the storage device may store images to be displayed and videos to be played. When an image or a video needs to be displayed on the display module 2 to be tested, an image and a video stored in advance on the storage device may be sent via the storage interface 6 to the display module 2 to be tested for test.

As an optional implementation, the display module test platform provided in this embodiment further includes a power supply 7. The power supply 7 is connected to the display module 2 to be tested and the core processor 1 respectively, and is configured to supply power to the display module 2 to be tested and the core processor 1, to ensure that the display module 2 to be tested and the core processor 1 can normally work.

In addition, the power supply 7 is further connected to various interfaces such as the input interface 4, the UART interface 5, and the storage interface 6 in the foregoing to supply power to the input interface 4, the UART interface 5, and the storage interface 6. The power supply 7 is further connected to the bridge module 3 to supply power to the bridge module 3.

In a specific implementation, the power supply 7 generally outputs a 5V direct current (DC) voltage. The 5V DC voltage may be directly output to the core processor 1. However, the 5V DC voltage needs to be reduced by a power supply voltage reducer 8 before the power supply voltage reducer 8 supplies power to the foregoing interfaces, the bridge module 3, and the display module 2 to be tested.

Figure 2:
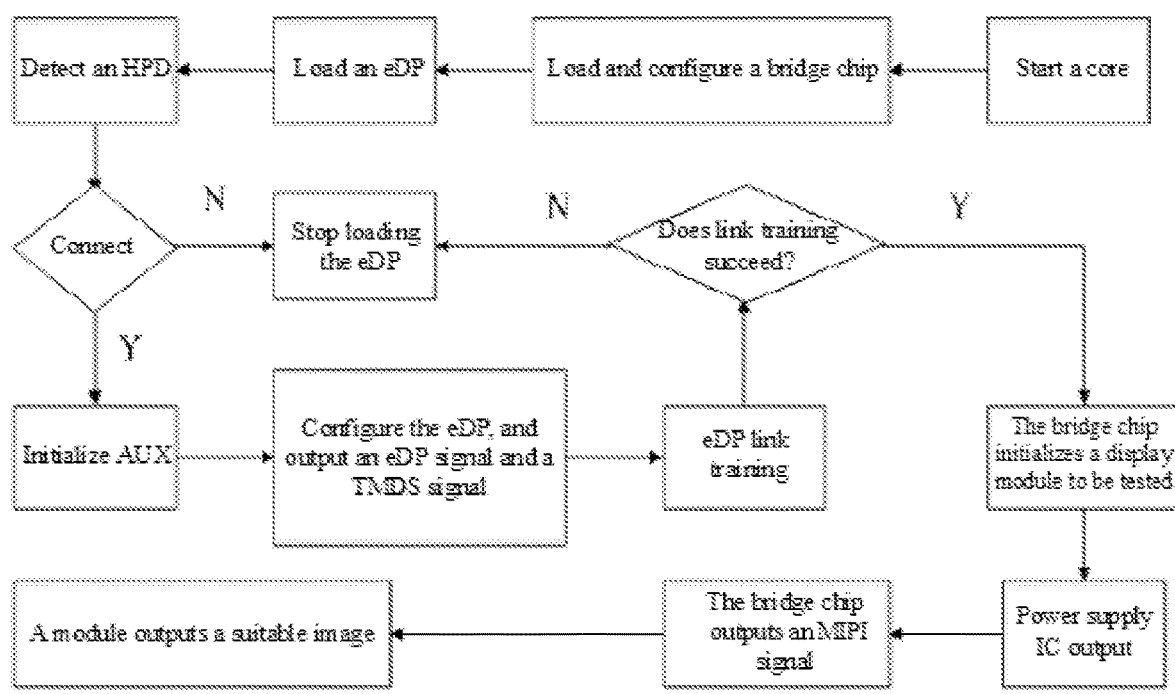
FIG. 2 shows a method for initializing a display module test platform according to an embodiment of the present application.

As shown in FIG. 2, a specific example of a process of initializing the display module test platform provided in this embodiment is described below:

Step 1. Build a compiling environment. Specifically, a virtual machine VMWare and Ubuntu 12.04 are installed to enable the compilation of an Android operating system.

Step 2. Start a core, and load a driver of an eDP to MIPI bridge chip.

Step 3. The bridge chip requests an I²C bus to perform initialization.

Step 4. Load a driver of an eDP bus.

Step 5. Detect, by using a Hot Plug Detect (HPD) pin, whether the bridge chip is connected, and if the bridge chip is not connected, perform step 6, or if the bridge chip is connected, perform step 7.

Step 6. Stop loading an eDP driving procedure.

Step 7. Initialize an auxiliary (AUX) channel. The AUX channel uses a differential transmission mode for transmission of data with a low bandwidth requirement, link management, and device control.

Step 8. An ARM processor reads and writes display parameters, eDP configuration data, and the like by using the AUX channel.

Step 9. Mount the eDP bus successfully, and output an eDP signal.

Step 10. Enter an eDP link training stage, including adjusting the amplitude of a link layer signal and a voltage intensity, testing an on-off state, and the like. If the eDP link training stage fails, stop loading the eDP driving procedure, or if the eDP link training stage succeeds, perform step 11.

Step 11. The bridge chip initializes a display module to be tested.

Step 12: A driver chip in the display module to be tested initializes a power supply, to enable the power supply to output a voltage required by the display module to be tested.

Step 13: The bridge chip outputs an MIPI image signal to the display module to be tested, wherein the display module to be tested implements image display.

Obviously, the foregoing embodiments are merely intended for clearly describing the examples rather than limiting the implementations. Persons of ordinary skill in the art may further make various changes or variations in other different forms based on the foregoing description. It is unnecessary and impossible to exhaustively list all the implementations herein. However, any obvious changes or variations derived from the foregoing description still fall within the protection scope of the present application.

The invention claimed is:

1. A display module test platform, comprising:
    a core processor, supporting installation of a terminal operating system, wherein a display output terminal of the core processor is connected to a display module to be tested, the display module to be tested comprises a touch structure, and the touch structure and the core processor communicate with each other via an Inter-Integrated Circuit (I²C) bus,
    the display output terminal of the core processor is connected to the display module to be tested via a bridge module, the bridge module and the core processor are connected by the I²C bus,
    wherein the bridge module is configured to convert an Embedded Display Port (eDP) signal sent by the core processor into a Mobile Industry Processor Interface (MIPI) signal recognizable by the display module to be tested, after performing an eDP link training stage.

2. The display module test platform according to claim 1, further comprising:
    a memory, connected to the core processor, and configured to store a correspondence relation between a model of a display module and configuration parameters, wherein
    the core processor is configured to: determine, according to the correspondence relation stored in the memory, configuration parameters corresponding to a model of the display module to be tested, and output the configuration parameters to the display module to be tested.

3. The display module test platform according to claim 1, further comprising an acquisition module, connected to the display module to be tested and the core processor, and configured to: acquire a voltage and a current of the display module to be tested, and send the voltage and current to the core processor.

4. The display module test platform according to claim 1, wherein the terminal operating system is any one of an Android operating system, an iOS operating system, a Windows operating system, and a Linux operating system.

5. The display module test platform according to claim 1, further comprising:
an input interface, connected to the core processor and an input device respectively, wherein the input device is configured to control the display module to be tested.

6. The display module test platform according to claim 5, wherein the input interface is an On-The-Go interface, and the input device connected to the On-The-Go interface is a mouse and/or a keyboard.

7. The display module test platform according to claim 1, further comprising:
a Universal Asynchronous Receiver-Transmitter interface, connected to the core processor, and configured to return test information of the display module to be tested.

8. The display module test platform according to claim 1, further comprising:
a storage interface, connected to the core processor and a storage device respectively, wherein the storage device is configured to store test images and test videos.

9. The display module test platform according to claim 1, wherein the core processor is a processor based on an Advanced Reduced Instruction Set Computing Machine architecture.

10. The display module test platform according to claim 1, further comprising:
a power supply, connected to the display module to be tested and the core processor respectively, and configured to supply power to the display module to be tested and the core processor.

11. The display module test platform according to claim 2, further comprising an acquisition module, connected to the display module to be tested and the core processor respectively, and configured to: acquire a voltage and a current of the display module to be tested, and send the voltage and current to the core processor.

12. The display module test platform according to claim 11, further comprising:
an input interface, connected to the core processor and an input device respectively, wherein the input device is configured to control the display module to be tested.

13. The display module test platform according to claim 12, further comprising:
a Universal Asynchronous Receiver-Transmitter interface, connected to the core processor, and configured to return test information of the display module to be tested.

14. The display module test platform according to claim 13, further comprising:
a storage interface, connected to the core processor and a storage device respectively, wherein the storage device is configured to store test images and test videos.

15. The display module test platform according to claim 14, further comprising:
a power supply, connected to the display module to be tested and the core processor respectively, and configured to supply power to the display module to be tested and the core processor.

16. The display module test platform according to claim 1, wherein the bridge module is a bridge circuit or a bridge chip.

17. The display module test platform according to claim 1, further comprising:
a power supply, connected to the bridge module to supply power to the bridge module.

18. The display module test platform according to claim 1, further comprising:
an Embedded Display Port bus, wherein the core processor loads a driver of the Embedded Display Port bus.

19. The display module test platform according to claim 1, wherein
the bridge module requests the I$^2$C bus to perform initialization.

* * * * *